US011340719B1

(12) United States Patent
Lin et al.

(10) Patent No.: US 11,340,719 B1
(45) Date of Patent: May 24, 2022

(54) OMNIDIRECTIONAL TOUCHPAD PRESS DEVICE

(71) Applicant: SUNREX TECHNOLOGY CORP., Taichung (TW)

(72) Inventors: Shih-Pin Lin, Taichung (TW); Chun-Chieh Chen, Taichung (TW); Yi-Wen Tsai, Taichung (TW); Ling-Cheng Tseng, Taichung (TW); Ching-Yao Huang, Taichung (TW); Yu-Shuo Yang, Taichung (TW); Yu-Xiang Geng, Taichung (TW)

(73) Assignee: SUNREX TECHNOLOGY CORP., Taichung (TW)

( * ) Notice: Subject to any disclaimer, the term of this patent is extended or adjusted under 35 U.S.C. 154(b) by 0 days.

(21) Appl. No.: 17/443,690

(22) Filed: Jul. 27, 2021

(30) Foreign Application Priority Data

Apr. 6, 2021 (TW) .................................. 110203674

(51) Int. Cl.
*G06F 3/041* (2006.01)
*G06F 3/0354* (2013.01)
*G06F 1/16* (2006.01)
*H03K 17/96* (2006.01)

(52) U.S. Cl.
CPC .......... *G06F 3/03547* (2013.01); *G06F 1/169* (2013.01); *G06F 3/0414* (2013.01); *H03K 17/96* (2013.01); *G06F 2203/04105* (2013.01)

(58) Field of Classification Search
CPC .... G06F 3/03547; G06F 1/169; G06F 3/0414; G06F 2203/04105; G06F 3/041; H03K 17/96
See application file for complete search history.

(56) References Cited

U.S. PATENT DOCUMENTS

| 2019/0243475 A1* | 8/2019 | Huang | G06F 1/1681 |
| 2020/0133334 A1* | 4/2020 | Chen | G06F 1/1681 |
| 2020/0273641 A1* | 8/2020 | Lu | G06F 1/1664 |

FOREIGN PATENT DOCUMENTS

TW            I659344          5/2019

* cited by examiner

*Primary Examiner* — Lunyi Lao
*Assistant Examiner* — Jarurat Suteerawongsa
(74) *Attorney, Agent, or Firm* — Burris Law, PLLC (57) ABSTRACT

A touchpad press device includes a support unit having two first sides interconnecting between two second sides, and first engaging members proximate to the second sides. A touch unit with a touch switch is disposed above the support unit, and a transmission unit is disposed between the support unit and the touch unit. The transmission unit includes peripheral plates, each of which is disposed above one of the second sides and has second engaging members, and a pressing plate to trigger the touch switch. When one of the peripheral plates is pressed downward through the touch unit, the other peripheral plate turns upward so that the second engaging members thereof engage the respective first engaging members to limit the other peripheral plate from moving further upward.

12 Claims, 11 Drawing Sheets

OMNIDIRECTIONAL TOUCHPAD PRESS DEVICE

CROSS-REFERENCE TO RELATED APPLICATION

This application claims priority to Taiwanese Utility Model Application No. 110203674, filed on Apr. 6, 2021.

FIELD

The disclosure relates to an input device of an electronic device, and more particularly to an omnidirectional touchpad press device.

BACKGROUND

A notebook computer generally includes a keyboard and a touchpad press device as input devices. The touchpad press device includes a touch region to control cursor movement and striking modules functioning as right, intermediate and left press keys of a mouse.

The touchpad press device as disclosed in Taiwanese Patent No. I659344 includes a base plate, a circuit board and a touchpad plate stacked along a Z-axis. The base plate includes first and second hook seats disposed on a lateral side of the base plate, and a trigger portion disposed away from the first and second hook seats. The circuit board includes a support seat engaged to the base plate adjacent to the lateral side, and a resilient switch aligned with the trigger portion. The support seat includes resilient hooks engaged with the first hook seats, and limiting hooks engaged with the second hook seats.

To activate the resilient switch for sending a signal, the circuit board is pressed to be pivotally rotate relative to the lateral side of the base plate.

However, when the support seat of the circuit board, or a part of the circuit board adjacent to the support seat is pressed, the circuit board cannot be rotated relative to the lateral side of the base plate to trigger or activate the resilient switch.

SUMMARY

Therefore, an object of the present disclosure is to provide an omnidirectional touchpad press device that can alleviate at least one of the drawbacks of the prior art.

According to this disclosure, an omnidirectional touchpad press device includes a support unit, a touch unit, and a transmission unit.

The support unit has two opposite first sides, two opposite second sides connected between the first sides, two supporting faces respectively proximate to the first sides, and multiple first engaging members proximate to the second sides.

The touch unit is disposed above the support unit, and includes a face plate, a circuit board disposed at a bottom side of the face plate, a touch switch disposed at a bottom side of the circuit board.

The transmission unit is disposed between the support unit and the touch unit, and includes two positioning plates, two peripheral plates, two linking plates, a pressing plate, and a plurality of hinge ribs. The positioning plates are respectively fixed to the supporting faces. Each of The peripheral plates is proximal to one of the second sides of the support unit and has second engaging members to respectively engage the first engaging members. The linking plates are spaced apart from each other and disposed between the positioning plates and between the peripheral plates. The pressing plate is disposed between the linking plates and between the positioning plates. The pressing plate is aligned with the touch switch. The linking plates and the positioning plates are hinged to each other by some of the hinge ribs. The linking plates and the peripheral plates are hinged to each other by some of the hinge ribs. The linking plates and the pressing plate are hinged to each other by the rest of the hinge ribs.

When said touch unit is pressed at a location proximate to one of the second sides of the support unit, one of the peripheral plates is pressed downward, the linking plates pivot relative to the positioning plates, the pressing plate triggers the touch switch, and the other one of the peripheral plates turns upward at the other one of the second sides of the support unit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

FIGS. 1 to 4 illustrate, according to an embodiment of the disclosure, a touchpad press device including a base casing 10, a support unit 20, a touch unit 30, a transmission unit 40, a preload pad 50, a plurality of first screws 60, and a plurality of second screws 70.

The base casing 10 includes a surrounding wall 13 defining a through hole 11, and a top flange 130 protruding into the through hole 11 from a top end 13a of the surrounding wall 13. The top flange 130 has a flange top face 131 and a flange bottom face 133. The flange bottom face 133 is formed with a plurality of screw holes 134. The surrounding wall 13 further has a bottom end 13b opposite to the top end 13a of the surrounding wall 13. The flange bottom face 133 of the top flange 130 has multiple notches 135 spaced apart from each other. The notches 135 communicate with the through hole 11. The through hole 11 forms a receiving space 12 that is below the top flange 130 and that opens at the bottom end 13b. The receiving space 12 is larger than a top portion 111 of the through hole 11 surrounded by the top flange 130. The flange bottom face 133 is disposed at a junction of the top portion 111 of the through hole 11 and the receiving space 12.

The support unit 20 is fixed to the flange bottom face 133, and has a tray portion 21, a top frame 22, two support parts 26, multiple first engaging members 27, and a reinforcement frame member 28.

The tray portion 21 is in the form of a U-shaped cross-section, has a bottom sinking surface 25, and defines a sinking space 24 bounded by the bottom sinking surface 25.

The top frame 22 surrounds and connects a top end of the tray portion 21 distal from the bottom sinking surface 25. A top abutting face 23 is formed on top of the top frame 22 to face upwardly, and is fixed to the flange bottom face 133. The sinking space 24 sinks downwardly from the top abutting face 23. The bottom sinking surface 25 is disposed below the top abutting face 23. The top frame 22 has two spaced-apart first sides 221, two spaced-apart second sides 222, and a plurality of screw holes 223 formed in the first and second sides 221, 222. Each of the second sides 222 is connected between the first sides 221. The reinforcement frame member 28 is fixed to a bottom of said top frame 22.

Each of the support parts 26 projects upwardly from the bottom sinking surface 25 to the sinking space 24 in proximity to one of the first sides 221. Each of the support parts 26 has a supporting face 261 and a plurality of screw holes 262 extending downwardly from the support face 261. The supporting faces 261 of the support pars 26 are respectively proximate to the first sides 221 and are spaced apart from the flange top face 131 of the top flange 130. Each of the supporting faces 261 is lower than the top abutting face 23 and higher than the bottom sinking surface 25.

The first engaging members 27 are proximate to the second sides 222 and extend into the notches 135, respectively. Each of the first engaging members 27 has an engaging hole 271, and a lug 272 in the form of an inverted U-shape. The lug 272 has a top barrier rod 273, and two lateral rods 274 that are spaced apart from each other and that have top ends integrally connected to the top barrier rod 273, and bottom ends connected to a boundary edge of the engaging hole 271. In this embodiment, each of the engaging holes 271 of the first engaging members 27 is a stamped hole extending downwardly from one of the second sides 222 of the top frame 22 to the bottom sinking surface 25 of the tray portion 21. Each of the lugs 272 of the first engaging members 27 is a stamped part projecting upwardly from one of the second sides 222 of the top frame 22 and connected to a boundary edge of the respective engaging hole 271.

The touch unit 30 is disposed above the support unit 20, and includes a face plate 31, a circuit board 32 disposed at a bottom side of the face plate 31, and a touch switch 33 disposed at a bottom side of the circuit board 32.

The transmission unit 40 is disposed between the support unit 20 and the touch unit 30, and includes two positioning plates 41, two peripheral plates 43, two linking plates 42, a pressing plate 44, a plurality of hinge ribs 45, and two hollow portions 46. In this embodiment, the transmission unit 40 is received in the sinking space 24 and has an outer profile that does not extend beyond the sinking space 24.

The positioning plates 41 are spaced apart from each other along a Y-axis parallel to the second sides 222 and are respectively fixed to the supporting faces 261. Each of the positioning plates 41 has a plurality of screw holes 411.

The peripheral plates 43 are opposite to each other along an X-axis to connect the touch unit 30. Each of the peripheral plates 43 is proximal to one of the second sides 222 of the support unit 20 and has multiple second engaging members 47 to respectively connect the first engaging members 27. Each of the second engaging members 47 and a respective one of the first engaging members 27 are inserted one into the other. In this embodiment, each of the second engaging members 47 is in the form of a tab that protrudes outwardly from one of the peripheral plates 43 opposite the linking plates 42 and the positioning plates 41. Each of the second engaging members 47 is inserted into the engaging hole 271 of one of the first engaging members 27 and is retained in the engaging hole 271 and between the lateral rods 274 of the respective lug 272. The tab is movable upward and downward in the engaging hole 271 below the top barrier rod 273.

The linking plates 42 are spaced apart from each other along an X-axis parallel to the first sides 221 and are disposed between the positioning plates 41 and between the peripheral plates 43.

The pressing plate 44 are disposed between the linking plates 42 and between the positioning plates 41. The pressing plate 44 is aligned with the touch switch 33. In this embodiment, the pressing plate 44 is aligned along the Y-axis with the positioning plates 41 and is aligned along the X-axis with the linking plates 42.

The linking plates 42 and the positioning plates 41 are hinged to each other by some of the hinge ribs 45. The linking plates 42 and the peripheral plates 43 are hinged to each other by some of the hinge ribs 45. The linking plates 42 and the pressing plate 44 are hinged to each other by the rest of the hinge ribs 45. The transmission unit 40 further includes two hollow portions 46 each of which is defined between the linking plates 42 and between the pressing plate 44 and one of the positioning plates 41.

The preload pad 50 is disposed between the pressing plate 44 and the bottom sinking surface 25 and fixed to the tray portion 21 to provide a preload and to absorb production tolerance.

Referring back to FIGS. 1 and 2, the first screws 60 secure the support unit 20 to the flange bottom face 133 through the screw holes 223 of the first and second sides 221, 222 and the screw holes 134 of the flange bottom face 133. The second screw 70 secure the positioning plates 41 to the support parts 26 through the screw holes 411, 262 of the positioning plates 41 and the support parts 26.

As shown in FIGS. 4 to 9, after assembly, the second engaging members 47 of the peripheral plates 43 respectively are inserted into the engaging holes 271 of the first engaging members 27 of the support unit 20 and are retained in the respective engaging holes 271 by the respective lugs 272. The linking plates 42 and the peripheral plates 43 are spaced apart from the bottom sinking surface 25 of the support unit 20. As the pressing plate 44 is not pressed, the touch switch 33 is not triggered.

Figure 1:
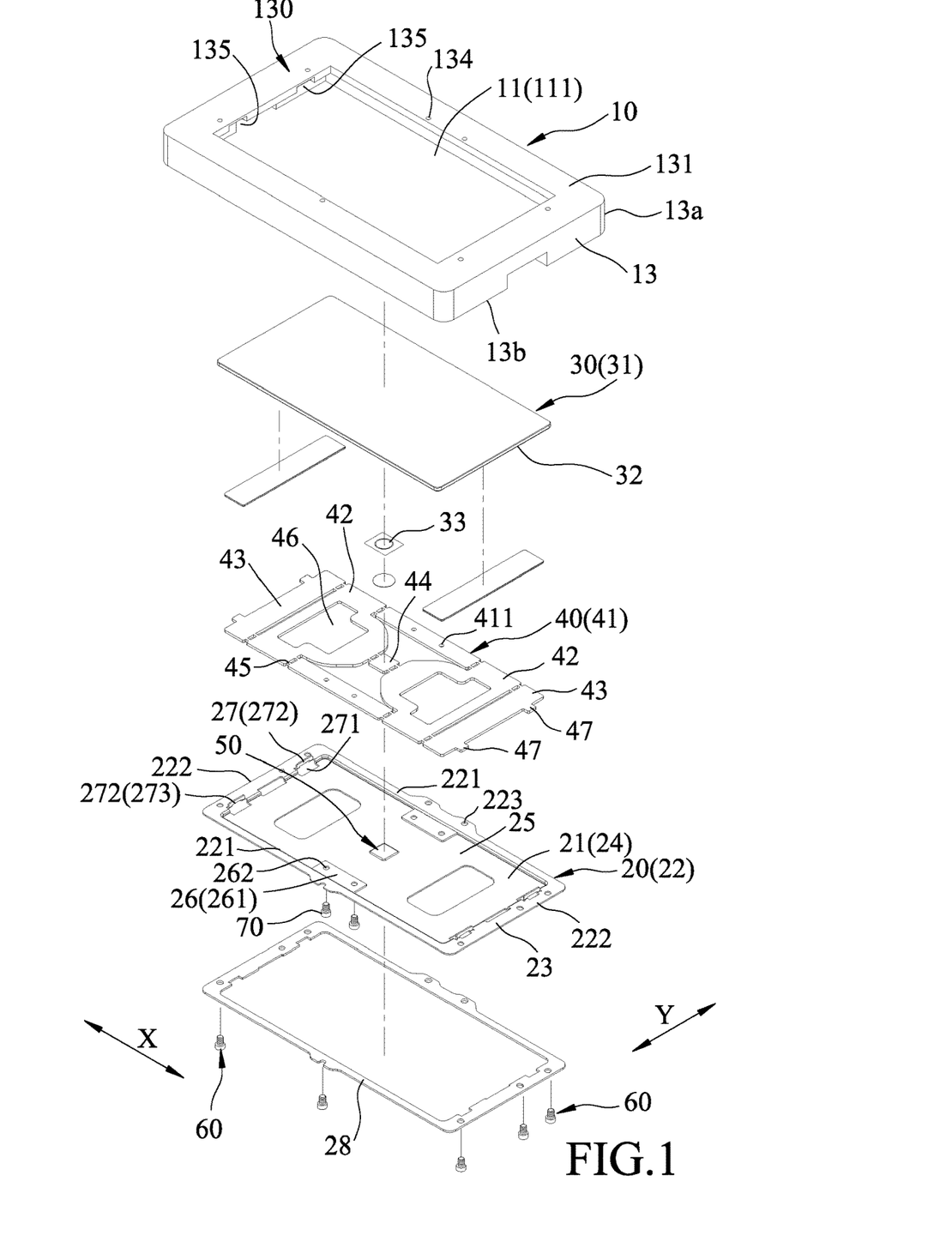
FIG. 1 is an exploded perspective top view of an omnidirectional touchpad press device according to an embodiment of the present disclosure.
Figure 2:
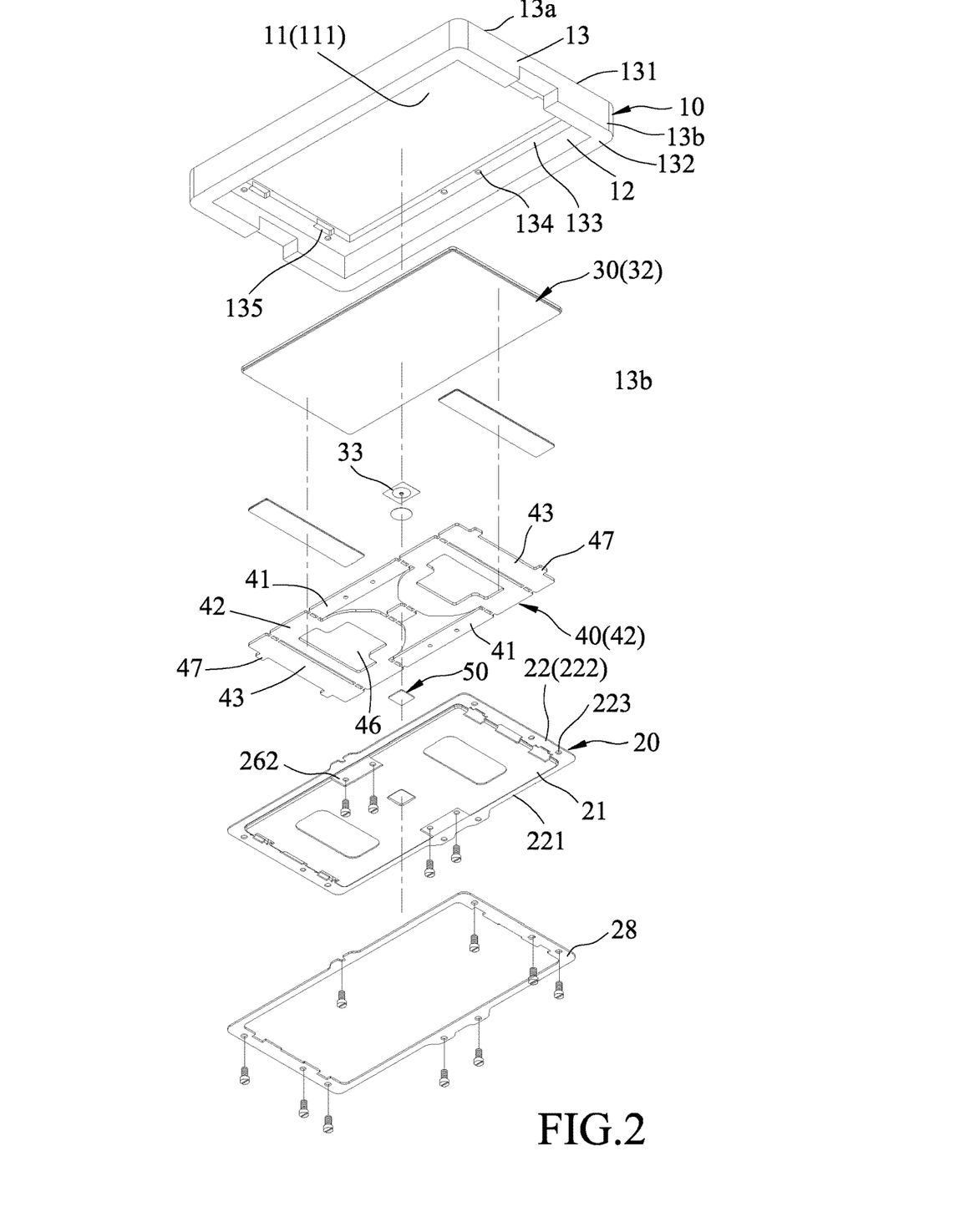
FIG. 2 is an exploded perspective bottom view of the embodiment.
Figure 3:
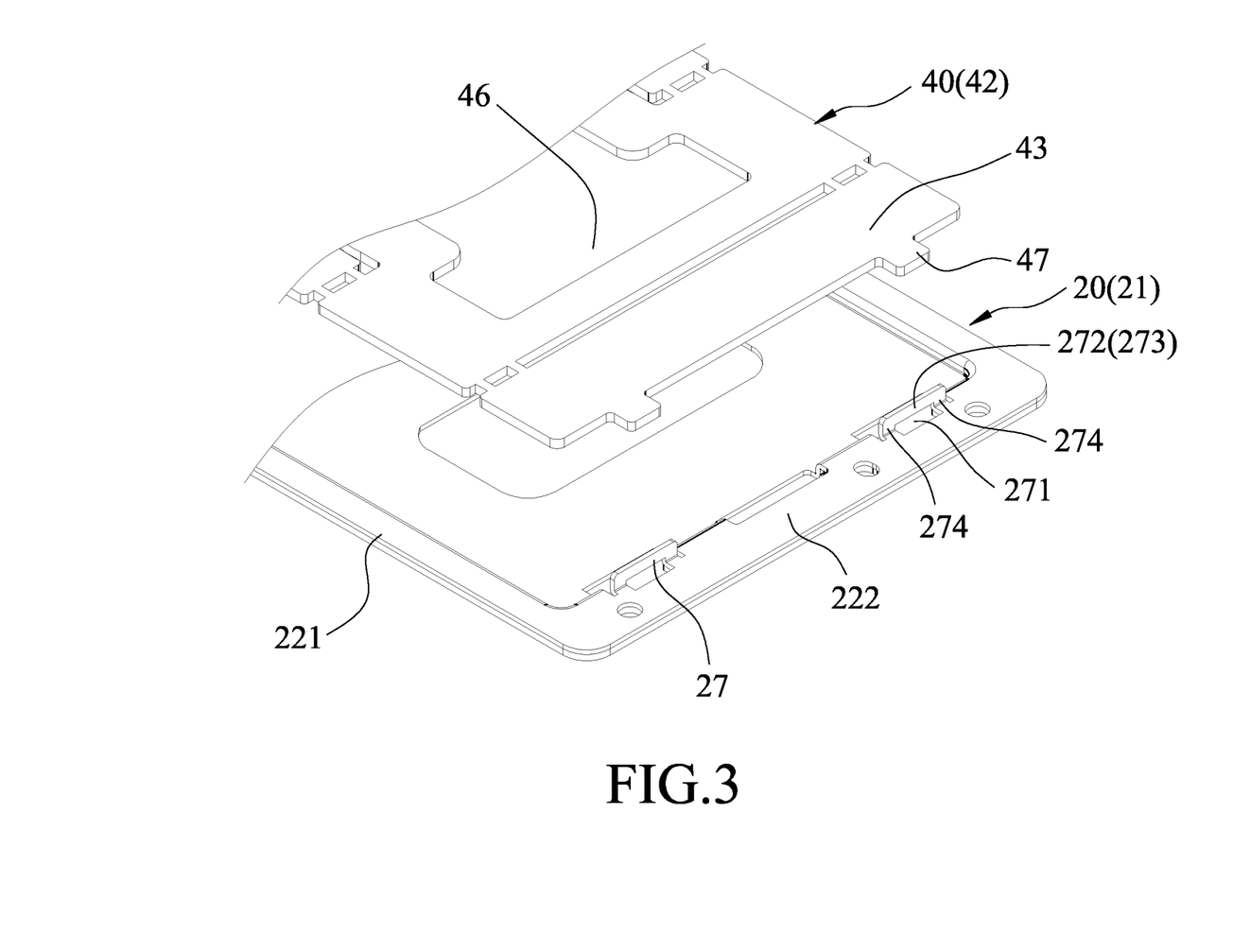
FIG. 3 is a perspective view of the embodiment illustrating a support unit and a transmission unit of the omnidirectional touchpad press device.
Figure 4:
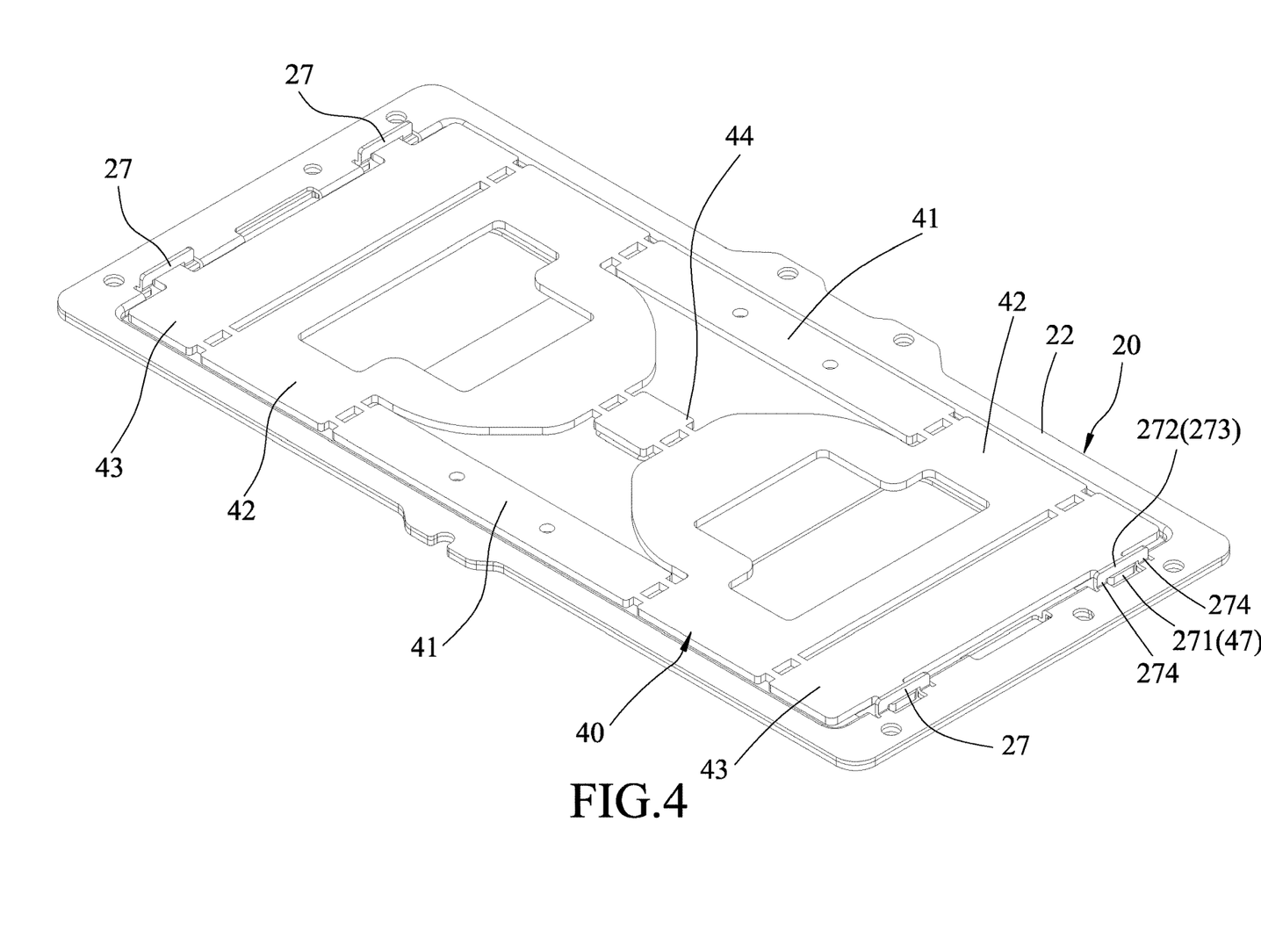
FIG. 4 is a perspective view of the embodiment illustrating the support unit and the transmission unit assembled with each other.
Figure 5:
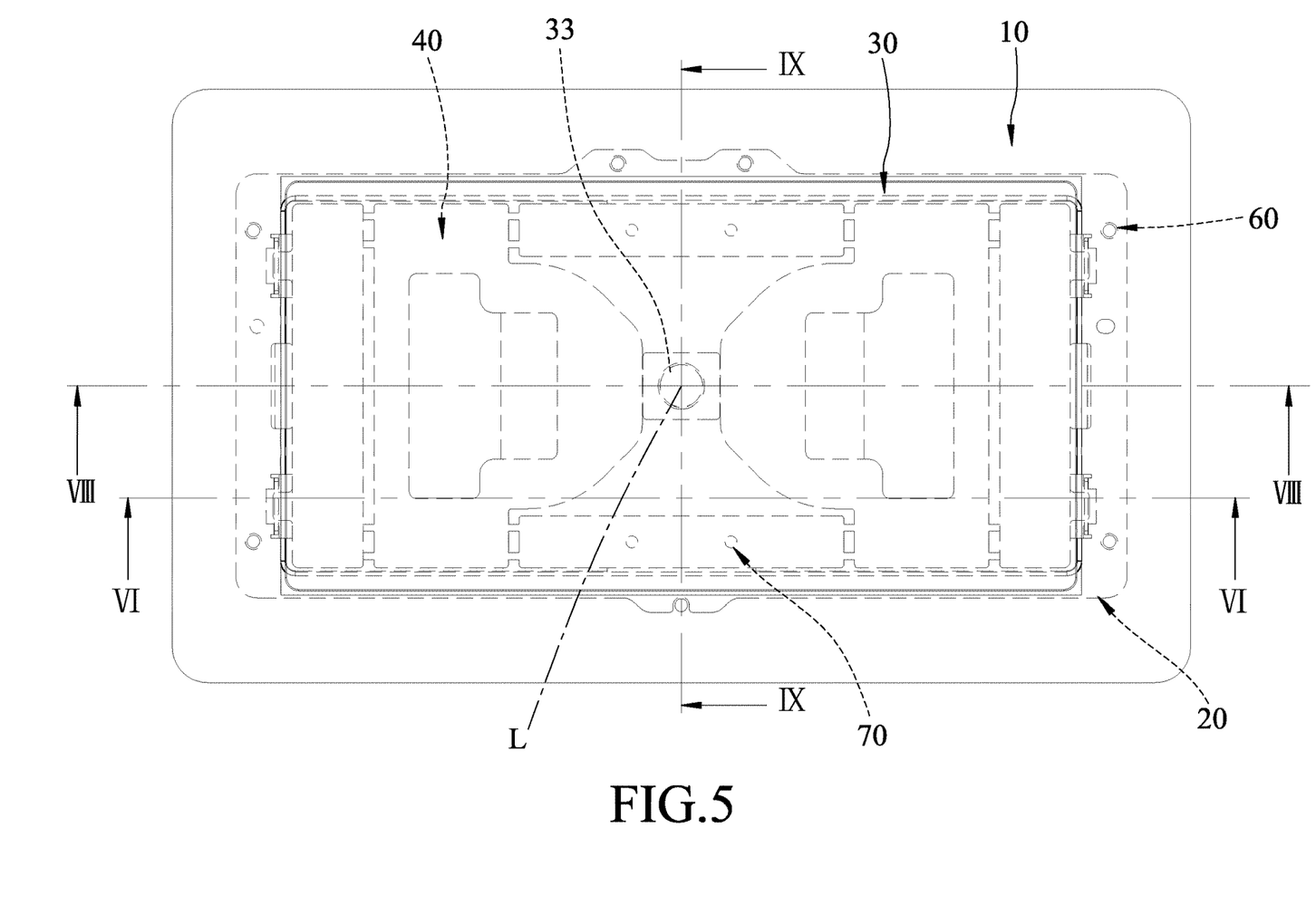
FIG. 5 is a top view of the embodiment.
Figure 10:
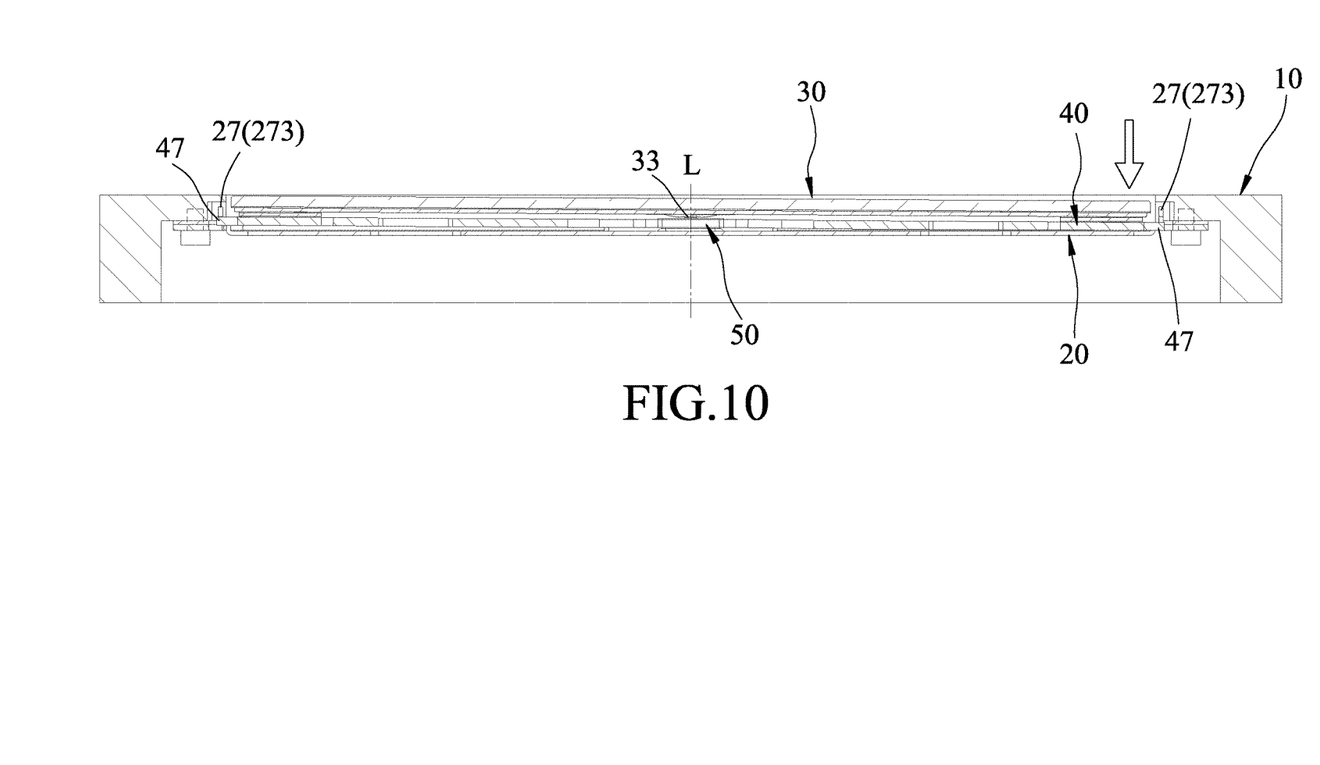
FIG. 10 is a side section view of the embodiment illustrating a touch switch of the omnidirectional touchpad press device in an triggered state.
Figure 11:
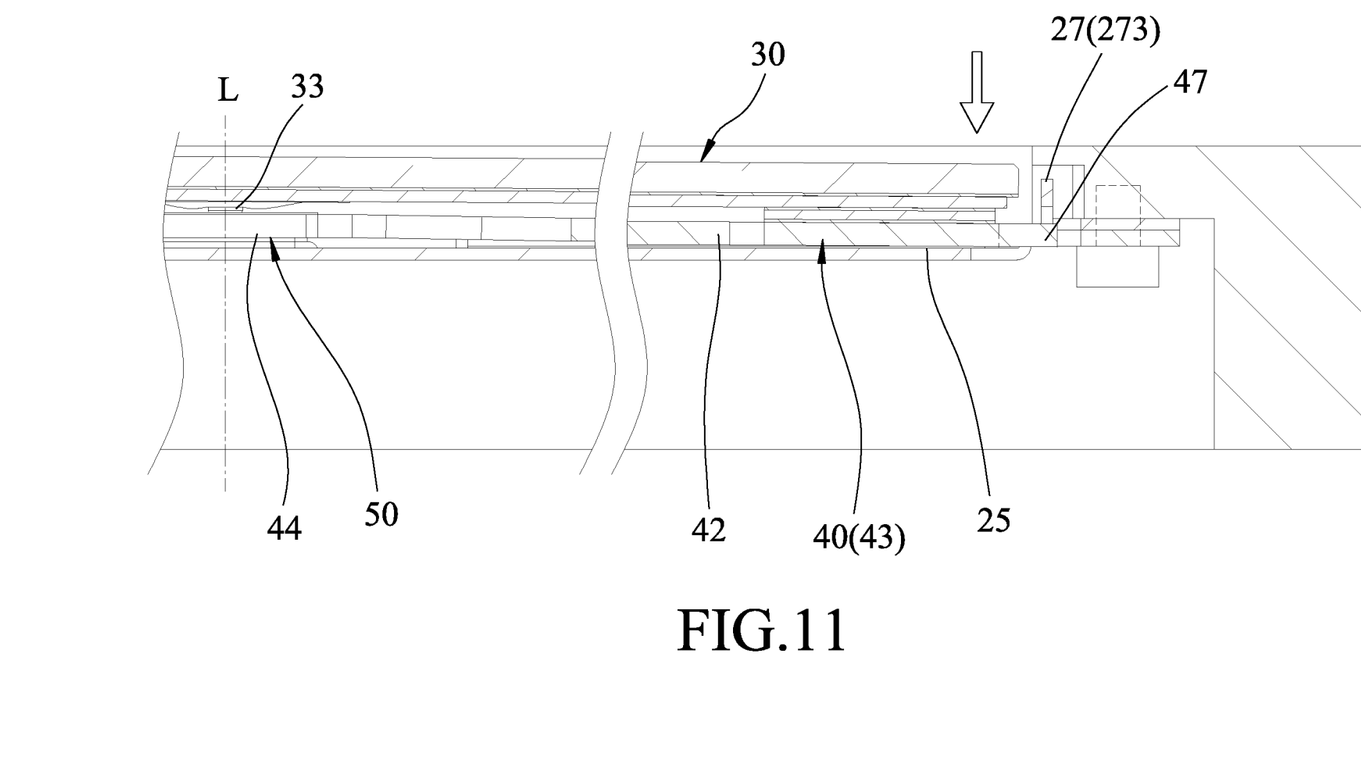
FIG. 11 is a partly enlarged view of FIG. 10.

Referring to FIGS. 10 and 11 in combination with FIGS. 1 and 3, when the right side of the touch unit 30 is pressed, the transmission unit 40 is flexibly deflected. Because the positioning plates 41, the peripheral plates 43, the linking plates 42 and the pressing plate 44 are hinged together by the hinge ribs 45, a pressing force applied to the touch unit 30 pushes the peripheral plates 43 and causes the linking plates 42 to pivot relative to the positioning plates 41, thereby pushing the pressing plates 44 downward to the preload pad 50. Because the preload pad 50 is fixed to the tray portion 21 of support unit 20, it generates a reaction force to trigger the touch switch 33. In this situation, the peripheral plates 43 and the linking plates 42 stores a restoring force. As the right side of the touch unit 3 is pressed, one of the peripheral plates 43 at the right side is moved downward and the other one of the peripheral plates 43 at the left side turns upward (see the left side of FIG. 10) so that the second engaging members 47 of the left peripheral plate 43 abut against the barrier rods 273 of the respective first engaging members 27 to limit further upward movement of the left peripheral plate 43. The second engaging members 47 at the right side are spaced from the top barrier rod 273 of the respective first engaging members 27 (see the right sides in FIG. 10 and FIG. 11).

To activate the touch switch 33, the pressing force can be applied to any point of the touch unit 30, even at the left or right side of the touch unit 30. When the touch unit 30 is pressed at any point, because the transmission unit 40 is disposed between the support unit 20 and the touch unit 30, and because the positioning plates 41 are secured to the support parts 26 by the second screws 70, and the linking plates 42, the peripheral plates 43 and the pressing plate 44 are interconnected through the hinge ribs 45, the transmission unit 40 is resiliently deformable.

Figure 6:
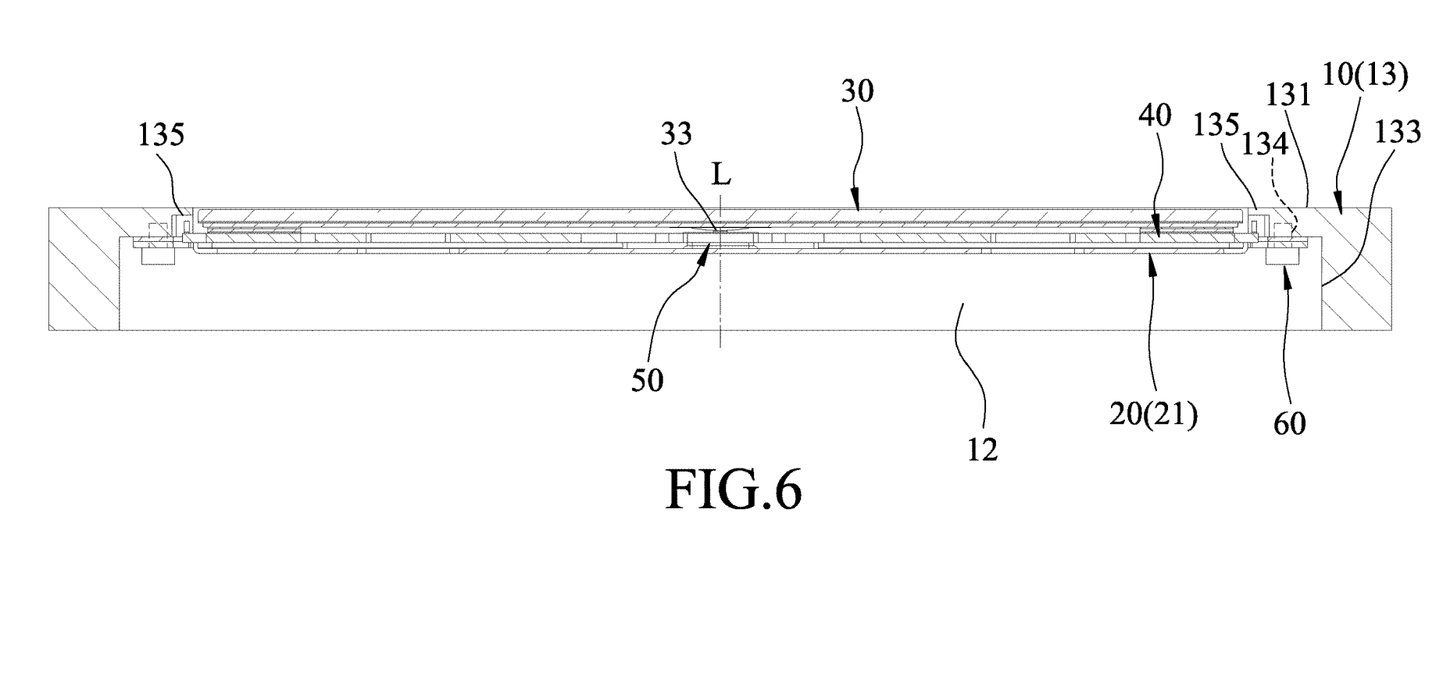
FIG. 6 is a side sectional view taken along line VI-VI of FIG. 5.
Figure 7:
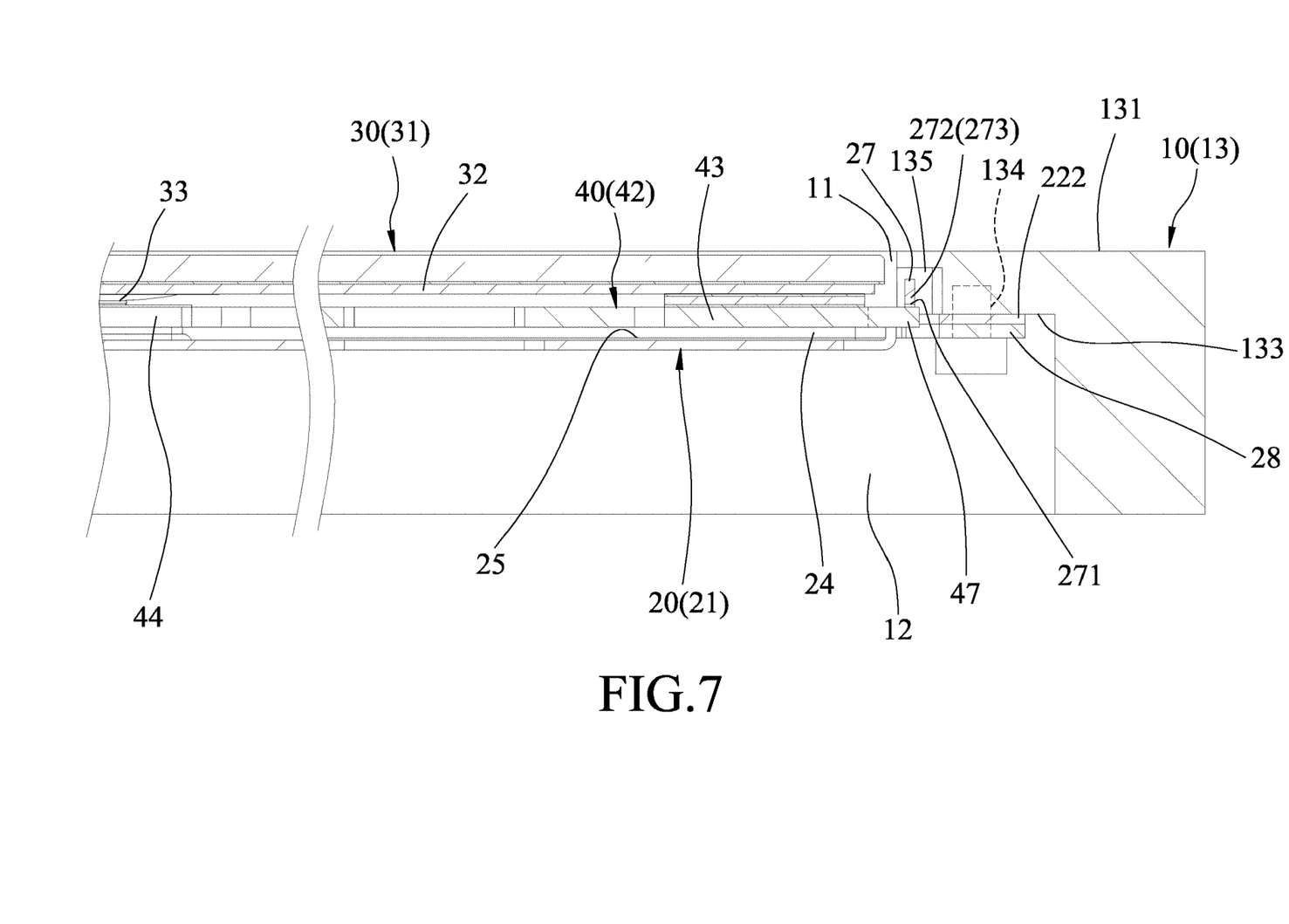
FIG. 7 is a partly enlarged view of FIG. 6.
Figure 8:
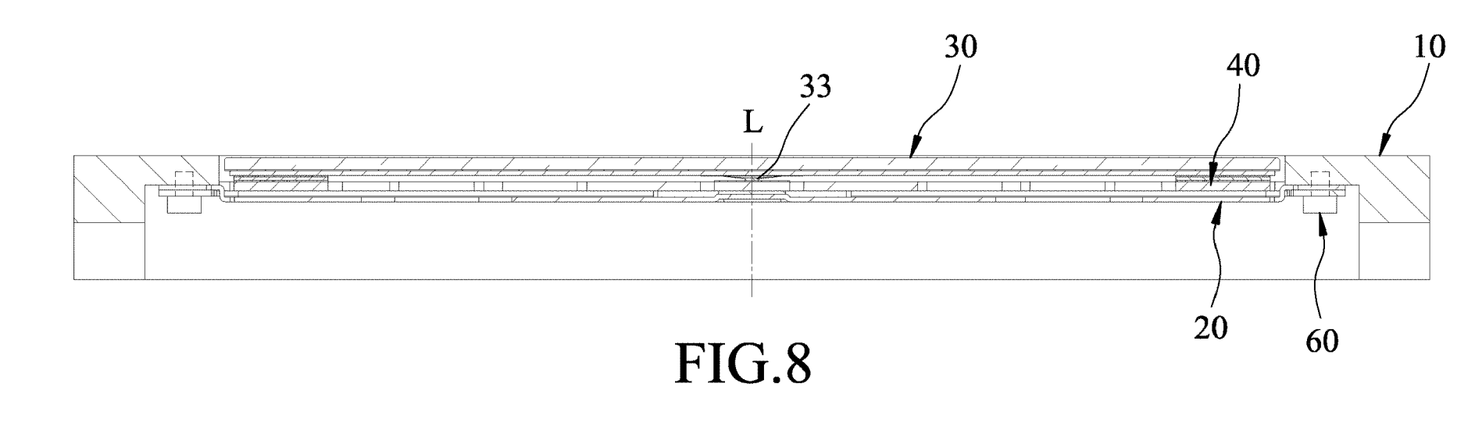
FIG. 8 is a side sectional view taken along line VIII-VIII of FIG. 5.
Figure 9:
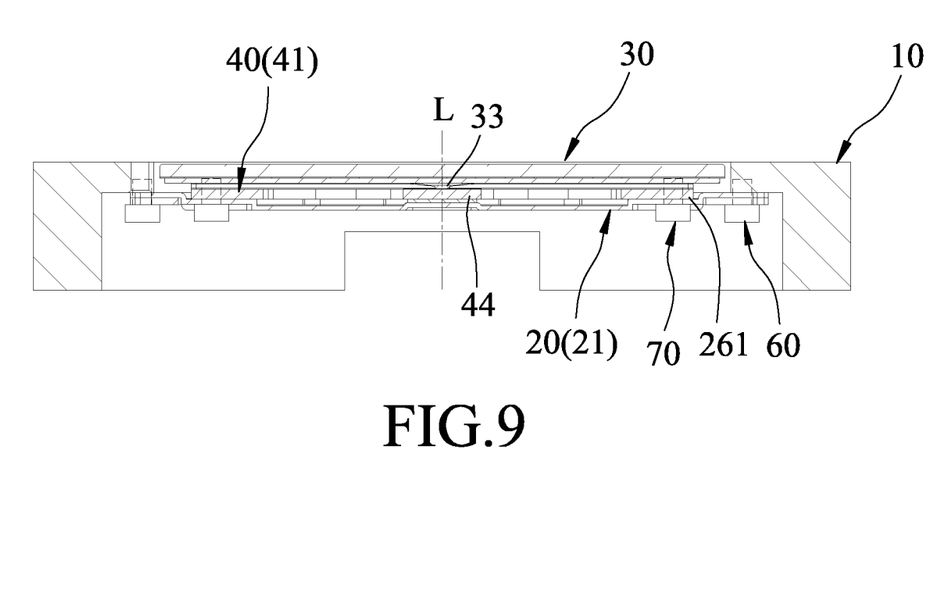
FIG. 9 is a side sectional view taken along line IX-IX of FIG. 5.

When the touch unit 30 is released from the pressing force, through the restoring force of the transmission unit 40, the linking plates 42 and the peripheral plates 43 can move upward and return to the positions shown in FIGS. 6 to 8.

Noteworthily, while each of the second engaging members 47 is in the form of a tab and each of the first engaging members 27 has the engaging hole 271 and the lug 272 in the form of an inverted U-shape in this embodiment, the configurations of the first and second engaging members 27 and 47 are not limited hereto as long as the first and second engaging members 27, 47 can interact with each other to limit the upward movement of the peripheral plates 43. For example, each of the first engaging members 27 may be in the form of an inverted L-shape tab (not shown), and each of the second engaging members 47 may be in the form of an inverted U-shape lug (not shown).

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An omnidirectional touchpad press device, comprising, a support unit having two opposite first sides, two opposite second sides connected between said first sides, two supporting faces respectively proximate to said first sides, and multiple first engaging members proximate to said second sides;
a touch unit disposed above said support unit, and including a face plate, a circuit board disposed at a bottom side of said face plate, and a touch switch disposed at a bottom side of said circuit board; and
a transmission unit disposed between said support unit and said touch unit, and including
  two positioning plates respectively fixed to said supporting faces,
  two peripheral plates each of which is proximal to one of said second sides of said support unit and has multiple second engaging members to respectively engage said first engaging members,
  two linking plates spaced apart from each other and disposed between said positioning plates and between said peripheral plates,
  a pressing plate disposed between said linking plates and between said positioning plates, said pressing plate being aligned with said touch switch, and
  a plurality of hinge ribs, said linking plates and said positioning plates being hinged to each other by some of said hinge ribs, said linking plates and said peripheral plates being hinged to each other by some of said hinge ribs, said linking plates and said pressing plate being hinged to each other by the rest of said hinge ribs.

2. The omnidirectional touchpad press device as claimed in claim 1, wherein each of said first engaging members has an engaging hole and a lug connected to a boundary edge of said engaging hole, each of said second engaging members is in the form of a tab that protrudes outwardly from one of said peripheral plates and that is movably inserted into said engaging hole and is retained in said engaging hole by said lug.

3. The omnidirectional touchpad press device as claimed in claim 2, wherein:
said lug is in the form of an inverted U-shape, said lug having a top barrier rod, and two lateral rods that are spaced apart from each other and that has top ends connected to said top barrier rod, and bottom ends connected to said boundary edge of said engaging hole;
each of said second engaging members being retained between said lateral rods and being movable upward and downward in said engaging hole below said top barrier rod.

4. The omnidirectional touchpad press device as claimed in claim 3, wherein:
said support unit further has a top abutting face that extends along said first and second sides and that faces upwardly, a sinking space sinking downwardly from said top abutting face, a bottom sinking surface that is disposed below said top abutting face and that bounds said sinking space, and two support parts each of which projects upwardly from said bottom sinking surface to said sinking space in proximity to one of said first sides;
said support parts respectively have said supporting faces, each of said supporting faces being lower than said top abutting face and higher than said bottom sinking surface.

5. The omnidirectional touchpad press device as claimed in claim 4, wherein:
said support unit further has a tray portion that is in the form of a U-shaped cross-section and that has said bottom sinking surface, and a top frame surrounding and connecting a top end of said tray portion distal from said bottom sinking surface, said tray portion defining said sinking space, said top abutting face being formed on top of said top frame;

said top frame has said first sides, and said second sides, and a plurality of screw holes formed in said first and second sides, each of said second sides being connected between said first sides;

said lateral rods of said first engaging members projecting upwardly from said second sides;

each of said support parts has a plurality of screw holes.

6. The omnidirectional touchpad press device as claimed in claim 5, further comprising abase casing, a plurality of first screws, and a plurality of second screws;

said base casing including a surrounding wall defining a through hole, and atop flange protruding into said through hole from a top end of said surrounding wall, said top flange having a flange top face and a flange bottom face, said flange bottom face being formed with a plurality of screw holes;

said top abutting face of said support unit is fixed to said flange bottom face;

each of said positioning plates has a plurality of screw holes; and said first screws secure said support unit to said flange bottom face through said screw holes of said first and second boundary portions and said screw holes of said flange bottom face, said second screws securing said positioning plates to said support parts through said screw holes of said positioning plates and said support parts.

7. The omnidirectional touchpad press device as claimed in claim 6, wherein:

said surrounding wall further has a bottom end opposite to said top end of said surrounding wall;

said flange bottom face of said top flange has multiple notches spaced apart from each other, said notches communicating with said through hole;

said through hole of said base casing forms a receiving space disposed below said top flange and opening at said bottom end, said receiving space being larger than atop portion of said through hole surrounded by said top flange;

said flange bottom face is disposed at a junction of said top portion of said through hole and said receiving space; and said first engaging members extend into said notches.

8. The omnidirectional touchpad press device as claimed in claim 1, wherein:

said linking plates are spaced apart from each other along an X-axis parallel to said first sides;

said peripheral plates are opposite to each other along the X-axis;

said positioning plates are spaced apart from each other along a Y-axis parallel to said second sides;

said pressing plate is aligned along the Y-axis with said positioning plates and is aligned along the X-axis with said linking plates; and said transmission unit further includes two hollow portions each of which is defined between said linking plates and between said pressing plate and one of said positioning plates.

9. The omnidirectional touchpad press device as claimed in claim 5, wherein said support unit further has a reinforcement frame member fixed to a bottom of said top frame.

10. The omnidirectional touchpad press device as claimed in claim 5, wherein each of said engaging holes of said first engaging members is a stamped hole extending downwardly from one of said second sides of said top frame to said bottom sinking surface of said tray portion, each of said lugs of said first engaging members being a stamped part projecting upwardly from one of said second sides and connecting a boundary edge of a respective one of said engaging holes.

11. An omnidirectional touchpad press device, comprising, a support unit having two opposite first sides, two opposite second sides connected between said first sides, and two supporting faces respectively proximate to said first sides;

a touch unit disposed above said support unit, and including a face plate, a circuit board disposed at a bottom side of said face plate, and a touch switch disposed at a bottom side of said circuit board; and a transmission unit disposed between said support unit and said touch unit, and including two positioning plates respectively fixed to said supporting faces, two peripheral plates each of which is proximal to one of said second sides of said support unit, two linking plates spaced apart from each other and disposed between said positioning plates and between said peripheral plates, a pressing plate disposed between said linking plates and between said positioning plates, said pressing plate being aligned with said touch switch, and a plurality of hinge ribs, said linking plates and said positioning plates being hinged to each other by some of said hinge ribs, said linking plates and said peripheral plates being hinged to each other by some of said hinge ribs, said linking plates and said pressing plate being hinged to each other by the rest of said hinge ribs, wherein, when said touch unit is pressed at a location proximate to one of said second sides of said support unit, one of said peripheral plates is pressed downward, said linking plates pivot relative to said positioning plates, said pressing plate triggers said touch switch, and the other one of said peripheral plates turns upward at the other one of said second sides of said support unit.

12. The omnidirectional touchpad press device as claimed in claim 11, wherein said support unit further has multiple first engaging members proximate to said second sides; and each of said peripheral plates has multiple second engaging members each of which is engageable with one of said first engaging members to limit further upward movement of said other one of said peripheral plates when said one of said peripheral plates is pressed downward.

* * * * *